(12) United States Patent
Hiroki et al.

(10) Patent No.: US 9,995,378 B2
(45) Date of Patent: Jun. 12, 2018

(54) DRIVE DEVICE AND SUBSTRATE PROCESSING SYSTEM

(71) Applicant: TOKYO ELECTRON LIMITED, Tokyo (JP)

(72) Inventors: Tsutomu Hiroki, Nirasaki (JP); Toshinao Kato, Kikugawa (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 313 days.

(21) Appl. No.: 14/228,912

(22) Filed: Mar. 28, 2014

(65) Prior Publication Data

US 2014/0209241 A1    Jul. 31, 2014

Related U.S. Application Data

(63) Continuation of application No. PCT/JP2012/074558, filed on Sep. 25, 2012.

(30) Foreign Application Priority Data

Sep. 30, 2011  (JP) .................. 2011-218121

(51) Int. Cl.
  *H01L 21/677* (2006.01)
  *F16H 25/14* (2006.01)
  *H01L 21/67* (2006.01)

(52) U.S. Cl.
  CPC ......... *F16H 25/14* (2013.01); *H01L 21/6719* (2013.01); *H01L 21/67161* (2013.01);
  (Continued)

(58) Field of Classification Search
  None
  See application file for complete search history.

(56) References Cited

U.S. PATENT DOCUMENTS 4,452,553 A * 6/1984 Kaminsky ............. B23B 29/034
  408/153
4,967,617 A * 11/1990 Maus .................... B21D 39/203
  403/277

(Continued)

FOREIGN PATENT DOCUMENTS

EP       2246514 A1     11/2010
JP    1989-120336 U     8/1989
(Continued)

OTHER PUBLICATIONS

Search Report issued in International Application No. PCT/JP2012/074558 dated Dec. 25, 2012, two (2) pages.

*Primary Examiner* — Karla A Moore
(74) *Attorney, Agent, or Firm* — Nath, Goldberg & Meyer; Jerald L. Meyer

(57) ABSTRACT

A drive device is provided to include: a case; a first motor and a second motor having an output shaft extending along a first axial line in the case and a second axial line parallel to the first axial line in the case, respectively; a first output shaft including a first shaft body and roller followers, the roller followers being engaged at a predetermined reduction gear ratio with the rib of the first motor; a second output shaft including a second shaft body and roller followers, the roller followers being engaged at a predetermined reduction gear ratio with the rib of the second motor; a first sealing member located between the case and the outer peripheral surface of the first shaft body; and a second sealing member located between an inner peripheral surface of the first shaft body and an outer peripheral surface of the second shaft body.

8 Claims, 14 Drawing Sheets

(52) U.S. Cl.
CPC .. *H01L 21/67196* (2013.01); *H01L 21/67201* (2013.01); *H01L 21/67742* (2013.01); *Y10T 74/18576* (2015.01)

(56) References Cited

U.S. PATENT DOCUMENTS

| | | | |
|---|---|---|---|
| 5,894,760 A * | 4/1999 | Caveney | B25J 18/04 310/114 |
| 6,679,131 B2 * | 1/2004 | Kato | B25J 9/109 74/107 |
| 2013/0074651 A1 * | 3/2013 | Furuichi | B25J 9/042 74/665 L |
| 2013/0202387 A1 | 8/2013 | Hiroki et al. | |
| 2013/0216335 A1 | 8/2013 | Hiroki et al. | |

FOREIGN PATENT DOCUMENTS

| JP | 2002-059329 A | | 2/2002 |
|---|---|---|---|
| JP | 2002-096285 A | | 4/2002 |
| JP | 2002096285 A | * | 4/2002 |
| JP | 2008-091534 A | | 4/2008 |

* cited by examiner

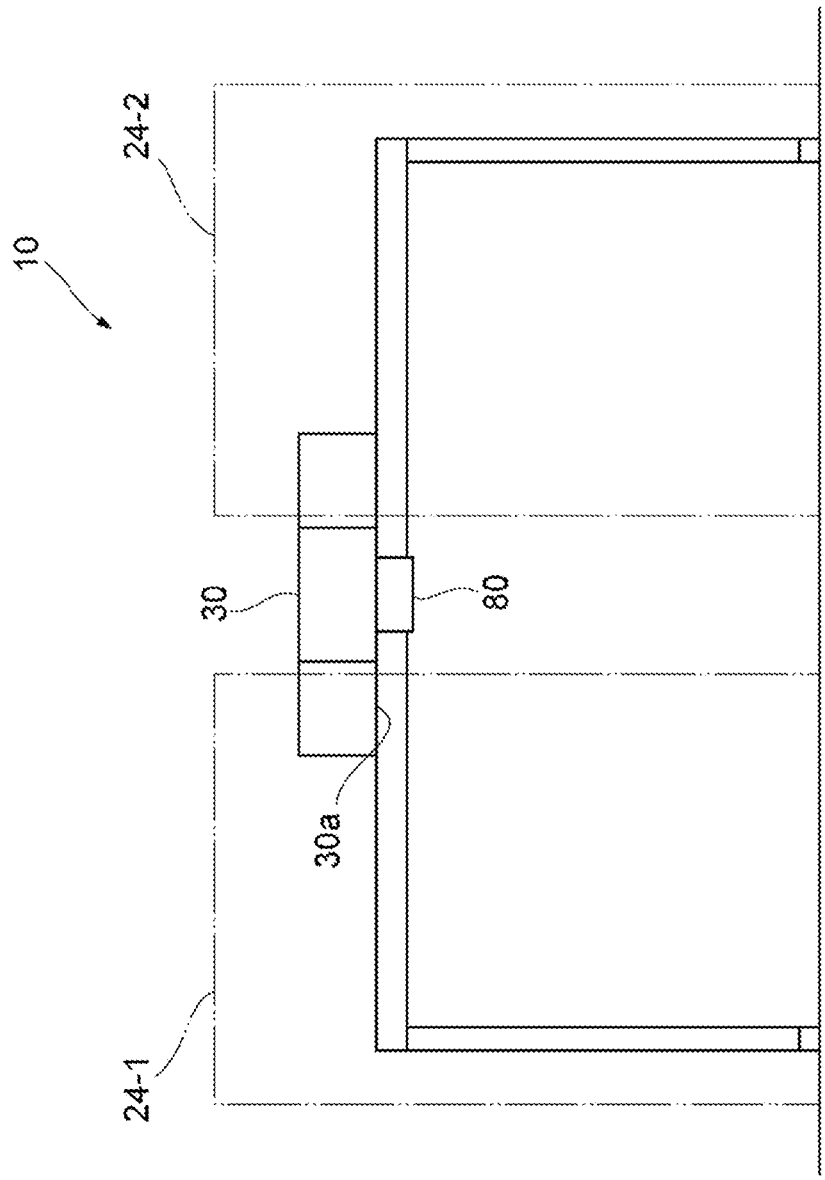

DRIVE DEVICE AND SUBSTRATE PROCESSING SYSTEM

CROSS-REFERENCE TO RELATED APPLICATIONS

This application is a Continuation Application of PCT International Application No. PCT/JP2012/074558, filed Sep. 25, 2012, which claimed the benefit of Japanese Patent Application No. 2011-218121, filed on Sep. 30, 2011, the entire content of each of which is hereby incorporated by reference.

TECHNICAL FIELD

Various aspects and embodiments of the present disclosure relate to a drive device and a substrate processing system having the drive device.

BACKGROUND

A drive device configured to drive two driven parts such as a pair of arms includes a drive device having two coaxial rotary driving shafts. Such a conventional drive device is applied to a tool magazine. The tool magazine includes a rotating main table and a sub-table rotatably installed at a periphery of the main table. The sub-table is provided with a plurality of "tool pots" (a registered trademark) configured to attach and detach tools. The tool magazine rotates the main table and the sub-table independently of each other, thereby moving a desired tool pot to a takeout position.

In addition, the tool magazine has a cylindrical outer shaft and an inner shaft passing through an inner hole of the outer shaft, in order to rotate the main table and the sub-table independently of each other. The outer shaft and the inner shaft are driven by different motors, respectively. The main table is installed at the outer shaft. A sun gear configured to rotate the sub-table is installed at the inner shaft. The sub-table is driven by a planet gear rotating around the sun gear.

There is a demand for using the drive device having two coaxial rotary shafts as described above in low pressure conditions. In this case, it is needed to provide a configuration for separating a space at an atmospheric pressure from a space at a low pressure in the drive device.

SUMMARY

Some embodiments of the present disclosure provide to a drive device having excellent sealability and maintenability when separating a space at a high-degree vacuum state.

According to one aspect of the present invention, there is provided a drive device, which includes a case; a first motor having an output shaft extending along a first axial line in the case, the output shaft including an outer peripheral surface having a rib formed in a spiral shape; a second motor having an output shaft extending along a second axial line parallel to the first axial line in the case, the output shaft including an outer peripheral surface having a rib formed in a spiral shape; a first output shaft including a first shaft body and roller followers, the first shaft body having a cylindrical shape extending along a third axial line extending in a direction perpendicular to the first axial line and the second axial line between the first and second axial lines, the first shaft body having one end extending outside the case and the other end accommodated within the case, the roller followers being installed on an outer peripheral surface of the other end and engaged at a predetermined reduction gear ratio with the rib of the first motor; a second output shaft including a second shaft body and roller followers, the second shaft body being installed coaxially with the first shaft body configured to pass through an inner hole of the first shaft body, the second shaft body having one end protruding to extend outside the case and the other end protruding to extend from the inner hole of the first shaft body into the case, the roller followers being installed on the other end of the second shaft body and engaged at a predetermined reduction gear ratio with the rib of the second motor; a first sealing member located between the case and the outer peripheral surface of the first shaft body; and a second sealing member located between an inner peripheral surface of the first shaft body and an outer peripheral surface of the second shaft body.

As described above, in the drive device having two coaxial rotary shafts, the first sealing member is located between the case and the outer peripheral surface of the first shaft body, and the second sealing member is located between the inner peripheral surface of the first shaft body and the outer peripheral surface of the second shaft body. Thus, the spaces inside and outside of the case of the drive device are separated from each other. With this configuration, even if the drive device is used in a high-degree vacuum state in a low pressure environment, a space at an atmospheric pressure and a space at a low pressure within the case of the drive device are separated from each other. Thus, the drive device can be used in the high-degree vacuum state in the low pressure environment.

In addition, the first sealing member is in contact with the first shaft body, which rotates at a rotational frequency smaller than that of the output shaft of the first motor. The second sealing member is in contact with the first shaft body, which rotates at a rotational frequency smaller than that of the output shaft of the first motor, and the second shaft body, which rotates at a rotational frequency smaller than that of the output shaft of the second motor. Accordingly, it is possible to improve sealability and maintenability of the first sealing member and the second sealing member, compared with a case in which the first sealing member or the second sealing member is in contact with the output shaft of the first motor or the output shaft of the second motor.

In addition, when viewing in the direction of the third axial line, the output shaft of the second motor and the output shaft of the first motor are parallel to each other, so that the output shafts do not overlap each other. With this configuration, the first motor and the second motor do not interfere with each other in the direction of the third axial line, and thus, the first motor and the second motor may be placed to overlap each other. That is, in order to prevent the first motor and the second motor from interfering with each other in the direction of the third axial line, it is not necessary to elongate the first output shaft or the second output shaft. As described above, the first output shaft and the second output shaft may be shortened, thereby making it possible to miniaturize the drive device. In addition, since the first output shaft and the second output shaft may be shortened, it is possible to improve the stiffness of the first output shaft and the second output shaft.

In one embodiment, the second sealing member may be installed at the first shaft body or the second shaft body. When the second sealing member is installed at the first output shaft, only a slideable contact portion of the second sealing member is in contact with the second output shaft. In addition, when the second sealing member is installed at the second output shaft, only a slideable contact portion of the second sealing member is in contact with the first output shaft. As described above, by installing the second sealing member at the first or the second output shaft, only the slideable contact portion of the second sealing member is in contact with the first or the second output shaft, thereby improving the sealability or maintenability of the second sealing member.

In one embodiment, the second shaft body may include a first portion having the one end of the second shaft body and a second portion having the other end of the second shaft body. The second portion may be a separate body from the first portion and be made of a material different from that of the first portion. By forming the first and the second portions of the second shaft body with different materials, the second shaft body can be formed according to the strength of the first output shaft. Thus, the strength of the first and the second output shafts can be set to be approximately equal.

In one embodiment, the first shaft body may include a first portion having the one end of the first shaft body and a second portion having the other end of the first shaft body. The second portion may be a separate body from the first portion and be made of a material different from that of the first portion. By forming the first the second portions of the first shaft body with different materials, the first shaft body can be formed according to the strength of the second output shaft. Thus, the strength of the first and the second output shafts can be set to be approximately equal.

In one embodiment, the roller followers of the first output shaft may have the same outer diameter as the roller followers of the second output shaft. With this configuration, the rotational angle of the first output shaft with respect to the rotation of the first motor and the rotational angle of the second output shaft with respect to the rotation of the second motor can be set to be equal. Thus, the rotational angles of the first and the second output shafts may be controlled more easily.

In one embodiment, the drive device may further include a bearing configured to support the first output shaft. The bearing may be installed between the outer peripheral surface of the first shaft body and the case, and also between the first sealing member and the other end of the first shaft body. In this case, the bearing configured to support the first output shaft may be placed proximate to the first sealing member. The vibration of the first output shaft decreases in the vicinity of a portion thereof which is supported by the bearing. Thus, the first sealing member is in contact with the portion at which the vibration of the first output is less, by placing the first sealing member in the vicinity of the bearing. Accordingly, it is possible to improve the sealability of the first sealing member.

In one embodiment, the bearing may extend along a closed curve having a diameter smaller than the outer diameter of the roller followers of the first output shaft. In this case, the bearing supports the first output shaft at the side of an axial center of the first output shaft, rather than at the outer diameter of the roller followers. With this configuration, it is possible to increase the stiffness of the first output shaft due to the bearing.

In one embodiment, the drive device may further include a bearing configured to support the second output shaft. The bearing extends along a closed curve having a diameter smaller than the outer diameter of the roller followers of the second output shaft, in between the outer peripheral surface of the other end of the second shaft body and the case. In this case, the bearing supports the second output shaft at the side of an axial center of the second output shaft, rather than at the outer diameter of the roller followers. With this configuration, it is possible to increase support the stiffness of the second output shaft due to the bearing.

In one embodiment, there is provided a substrate processing system including a loader module configured to transfer a substrate at an atmospheric pressure environment; a process module configured to process the substrate at a low pressure environment; and a transfer module configured to transfer the substrate and installed between the loader module and the process module. The transfer module includes a chamber wall configured to form a depressurizable transfer space; a transfer arm including a pair of arms installed within the transfer space; and the above-mentioned drive device installed at an outer surface of the chamber wall configured to secure the airtightness of the transfer space. In the transfer module, one of the pair of arms may be connected to the one end of the first shaft body, and the other end of the pair of arms may be connected to the one end of the second shaft body. Thus, it is possible to improve the sealability and maintenability of the drive device used for the transfer module of the substrate processing system.

As described above, according to various aspects and embodiments of the present invention, there are provided a drive device with excellent sealability and maintenability and a substrate processing system including the drive device.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 14 is a view of the surrounding of the second transfer chamber according to one embodiment as viewed from a back side of the substrate processing system.

DETAILED DESCRIPTION

Hereinafter, various embodiments will be described in detail with reference to the drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Also, in the respective drawings, the identical reference symbol is given to the identical or equivalent components.

Figure 1:
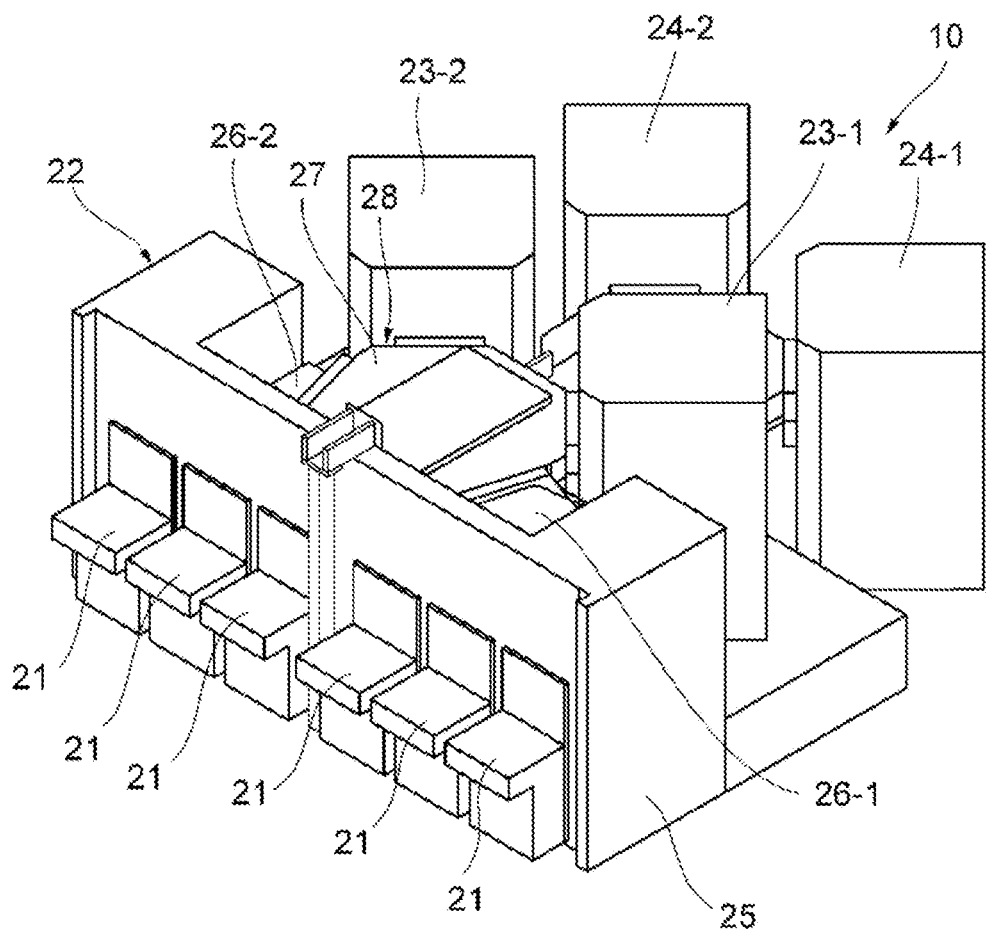
FIG. 1 is a perspective view of a substrate processing system provided with a vacuum transfer robot including a drive device according to one embodiment as viewed from a loader module side.
Figure 2:
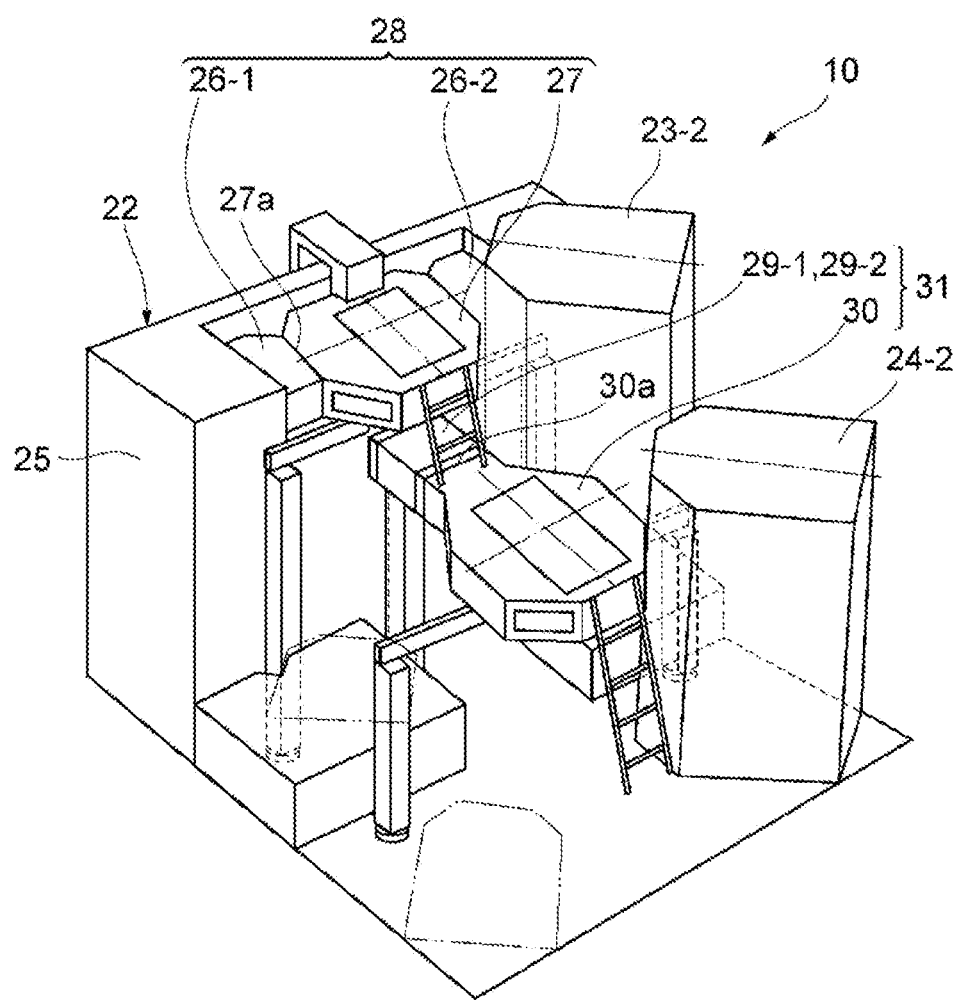
FIG. 2 is a perspective view of the substrate processing system according to one embodiment as viewed from a process chamber side.

FIG. 1 is a perspective view of a substrate processing system provided with a vacuum transfer robot including a drive device according to one embodiment as viewed from a loader module side. FIG. 2 is a perspective view of the substrate processing system provided with a vacuum transfer robot including a drive device according to one embodiment as viewed from a process chamber side. In FIG. 2, in order to show first and second transfer modules 28 and 31, a first process chamber 23-1 and a second process chamber 24-1 are omitted. Also in the following description, the term "front", as a term representing a direction, is used to represent a direction to which a port 21 is placed with respect to a loader module 22, and the term "rear" is used as a term representing the opposite direction. A substrate processing system 10 shown in FIGS. 1 and 2 includes the loader module 22, the first transfer module 28, the second transfer module 31, and the process chambers (process modules) 23-1, 23-2, 24-1 and 24-2.

The loader module 22 includes an atmospheric transfer chamber 25. A plurality (six in the example shown in FIG. 1) of the ports 21 are arranged in a line in front of the atmospheric transfer chamber 25. Cassettes each having a plurality of unprocessed substrates accommodated therein are set on the ports 21. The unprocessed substrates in each cassette are taken out one by one by an atmospheric transfer robot in the atmospheric transfer chamber 25, and then processed in the process chambers 23-1, 23-2, 24-1 and 24-2. In addition, the substrates processed in the process chambers 23-1, 23-2, 24-1 and 24-2 are returned to a cassette one by one by the atmospheric transfer robot in the atmospheric transfer chamber 25.

The first transfer module 28 includes first load lock chambers 26-1 and 26-2, and a first transfer chamber 27. The first load lock chambers 26-1 and 26-2 are connected to the loader module 22. Also, the first load lock chambers 26-1 and 26-2 are connected to the first transfer chamber 27. The first transfer chamber 27 is connected to the first process chambers 23-1 and 23-2.

The second transfer module 31 includes second load lock chambers 29-1 and 29-2, and a second transfer chamber 30. The second load lock chambers 29-1 and 29-2 are connected to the loader module 22. Also, the second load lock chambers 29-1 and 29-2 are connected to the second transfer chamber 30. The second transfer chamber 30 is connected to the second process chambers 24-1 and 24-2.

The four process chambers 23-1, 23-2, 24-1 and 24-2 are placed in an area of the back side of the loader module 22 in a 2×2 array. That is, the first process chambers 23-1 and 23-2 are placed at positions close to the loader module 22, whereas the second process chambers 24-1 and 24-2 are placed at positions spaced apart from the loader module 22.

The first and second process chambers 23-1, 23-2, 24-1 and 24-2 are configured to perform at least one process selected from the group consisting of film forming (the CVD method, the plasma CVD method, the PVD method, the ALD method), etching, ashing, oxidation, nitration, doping, diffusion and etc., or a combination of a plurality of processes selected from the group. For example, a process chamber configured to perform an etching process using plasma has various kinds of control devices, a gas supply system, a high frequency power supply unit etc. installed at an upper portion thereof and an exhaust unit configured to exhaust the interior of the chamber installed at a lower portion thereof.

The first transfer chamber 27 of the first transfer module 28 is placed between the first process chambers 23-1 and 23-2. The second transfer chamber 30 of the second transfer module 31 is placed between the second process chambers 24-1 and 24-2. The second process chambers 24-1 and 24-2 are placed further from the loader module 22 than the first process chambers 23-1 and 23-2. The length of the second transfer module 31 is greater than that of the first transfer module 28. In addition, the first transfer module 28 is placed at an upper portion, and the second transfer module 31 is placed at a lower portion.

The atmospheric transfer robot in the atmospheric transfer chamber 25 takes out the substrate from the cassette set to the port 21 and transfers the substrate to the first load lock chamber 26-1 or 26-2. A first vacuum transfer robot 56 in the first transfer chamber 27 (see FIG. 3B) transfers the substrate transferred to the first load lock chamber 26-1 or 26-2 to the first process chamber 23-1 or 23-2. When the processing at the first process chamber 23-1 or 23-2 is completed, the first vacuum transfer robot 56 in the first transfer chamber 27 takes out the substrate from the first process chamber 23-1 or 23-2 and transfers the substrate to the first load lock chamber 26-1 or 26-2. The atmospheric transfer robot in the atmospheric transfer chamber 25 takes out the substrate from the first load lock chamber 26-1 or 26-2 and stores the substrate in the cassette on the port 21.

In addition, the atmospheric transfer robot in the atmospheric transfer chamber 25 takes out the substrate from the cassette placed on the port 21 and transfers the substrate to the second load lock chamber 29-1 or 29-2. A second vacuum transfer robot 58 in the second transfer chamber 30 (see FIG. 3C) transfers the substrate transferred to the second load lock chamber 29-1 or 29-2 to the second process chamber 24-1 or 24-2. When the processing at the second process chamber 24-1 or 24-2 is completed, the second vacuum transfer robot 58 in the second transfer chamber 30 takes out the processed substrate from the second process chamber 24-1 or 24-2 and transfers the substrate to the second load lock chamber 29-1 or 29-2. The atmospheric transfer robot in the atmospheric transfer chamber 25 takes out the substrate from the second load lock chamber 29-1 or 29-2 and accommodates the substrate into the cassette on the port 21.

Figure 3:
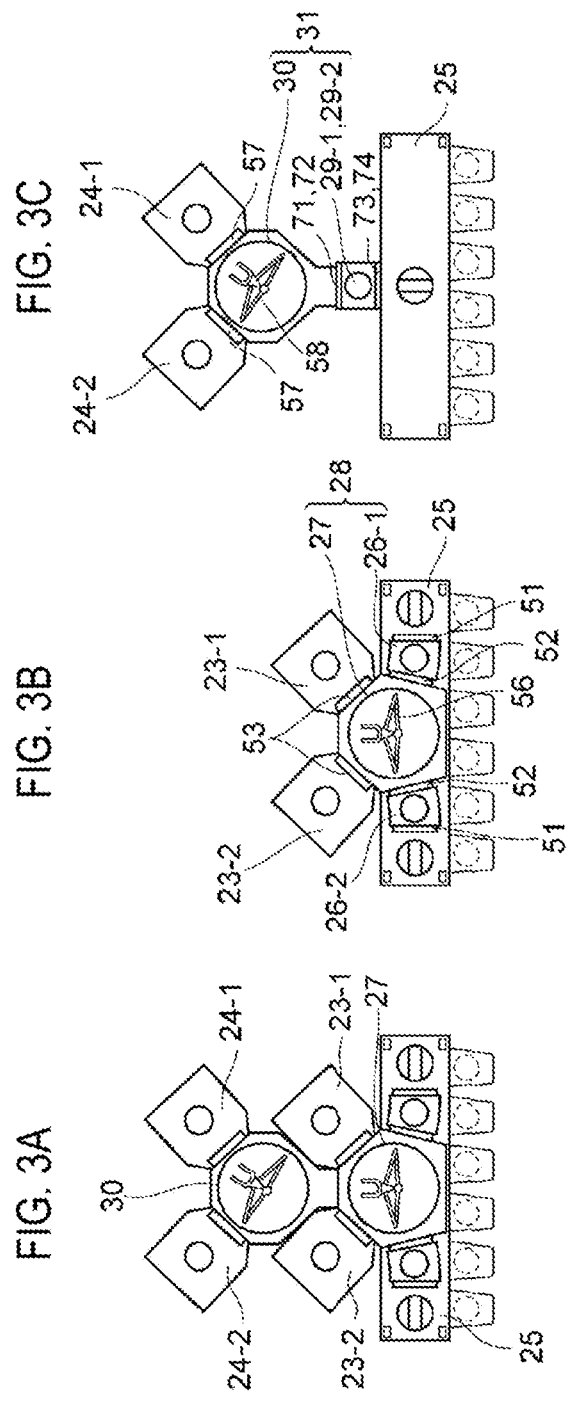
FIGS. 3A to 3C are plan views of the substrate processing system according to one embodiment.

FIGS. 3A to 3C are plan views of the substrate processing system. FIG. 3A shows the entirety of the substrate processing system, FIG. 3B shows the first transfer module 28 and the first process chambers 23-1 and 23-2 in the upper floor which are connected to the loader module 22, and FIG. 3C shows the second transfer module 31 and the second process chambers 24-1 and 24-2 in the lower floor which are connected to the loader module 22.

As shown in FIG. 3B, the two first process chambers 23-1 and 23-2 are connected to the first transfer chamber 27 of the first transfer module 28. Gate valves 51 are installed between the atmospheric transfer chamber 25 and the first load lock chambers 26-1 and 26-2, respectively. Gate valves 52 are installed between the first transfer chamber 27 and the first load lock chambers 26-1 and 26-2, respectively. Gate valves 53 are installed between the first transfer chamber 27 and the first process chambers 23-1 and 23-2, respectively. The first vacuum transfer robot 56 is installed within the first transfer chamber 27.

As shown in FIG. 3C, the two second process chambers 24-1 and 24-2 are connected to the second transfer chamber 30 of the second transfer module 31. Gate valves 73 and 74 are installed between the atmospheric transfer chamber 25 and the second load lock chambers 29-1 and 29-2, respectively. Gate valves 71 and 72 are installed between the second transfer chamber 30 and the second load lock chambers 29-1 and 29-2, respectively. Gate valves 57 are installed between the second transfer chamber 30 and the second process chambers 24-1 and 24-2, respectively. The second vacuum transfer robot 58 is installed within the second transfer chamber 30. For example, a transfer module described in US2013/0202387 may be used as the first and second transfer modules 28 and 31.

Figure 4:
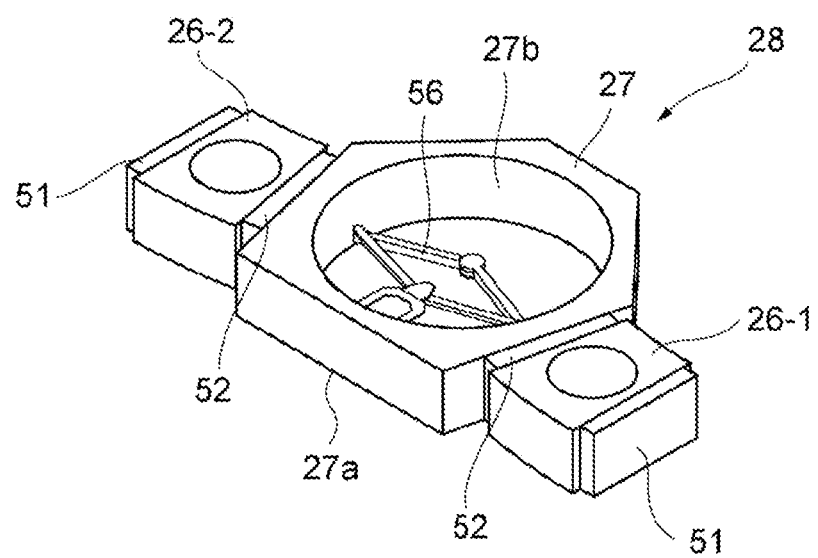
FIG. 4 is a perspective view showing a first load lock chamber and a first transfer chamber according to one embodiment.

FIG. 4 is a perspective view showing the first load lock chambers 26-1 and 26-2 and the first transfer chamber 27. The first load lock chambers 26-1 and 26-2 each include a small room where depressurizing and returning to an atmospheric pressure are performed repeatedly. The first transfer chamber 27 includes a transfer space 27b formed by a chamber wall 27a. The transfer space 27b can be depressurized by an exhaust device.

The first load lock chambers 26-1 and 26-2 each are equipped with a lifter configured to support the substrate and a lifter drive configured to elevate and lower the lifter. When the atmospheric transfer robot in the atmospheric transfer chamber 25 or the first vacuum transfer robot 56 loads the substrate into the first load lock chambers 26-1 and 26-2, the lifter is in a lowered position. When the loading of the substrate is completed, the lifter is elevated and receives the substrate from the atmospheric transfer robot in the atmospheric transfer chamber 25 or the first vacuum transfer robot 56. On the contrary, when the atmospheric transfer robot in the atmospheric transfer chamber 25 or the first vacuum transfer robot 56 takes out the substrate from the first load lock chambers 26-1 and 26-2, the lifter is in an elevated position. In the step when the atmospheric transfer robot in the atmospheric transfer chamber 25 or the first vacuum transfer robot 56 enters the first load lock chambers 26-1 and 26-2, the lifter is lowered, and the substrate is delivered from the lifter to the atmospheric transfer robot in the atmospheric transfer chamber 25 or the first vacuum transfer robot 56.

Figure 5:
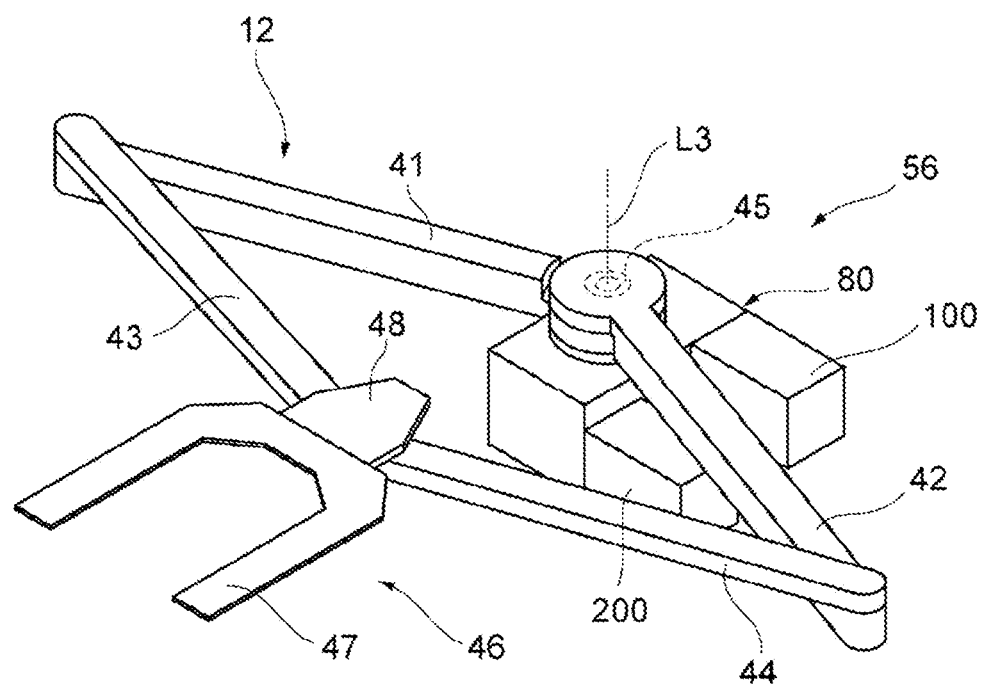
FIG. 5 is a perspective view showing a transfer mechanism and a drive device according to one embodiment.

FIG. 5 is a perspective view showing the first vacuum transfer robot 56. The first vacuum transfer robot 56 includes a transfer mechanism (a transfer arm) 12 and a drive device 80. The transfer mechanism 12 includes a first arm 41, a second arm 42, a first link 43, the second link 44 and a pick 46. The first arm 41 has one end joined to a central hub 45 of the drive device 80 and is rotationally driven around a third axial line L3 of the central hub 45 by a first motor 100 provided in the drive device 80. The second arm 42 also has one end joined to the central hub 45 of the drive device 80 and is rotationally driven around the third axial line L3 of the central hub 45 by a second motor 200 provided in the drive device 80. For example, transfer arms described in US2013/0216335 may be used as the transfer mechanism 12.

Figure 11:
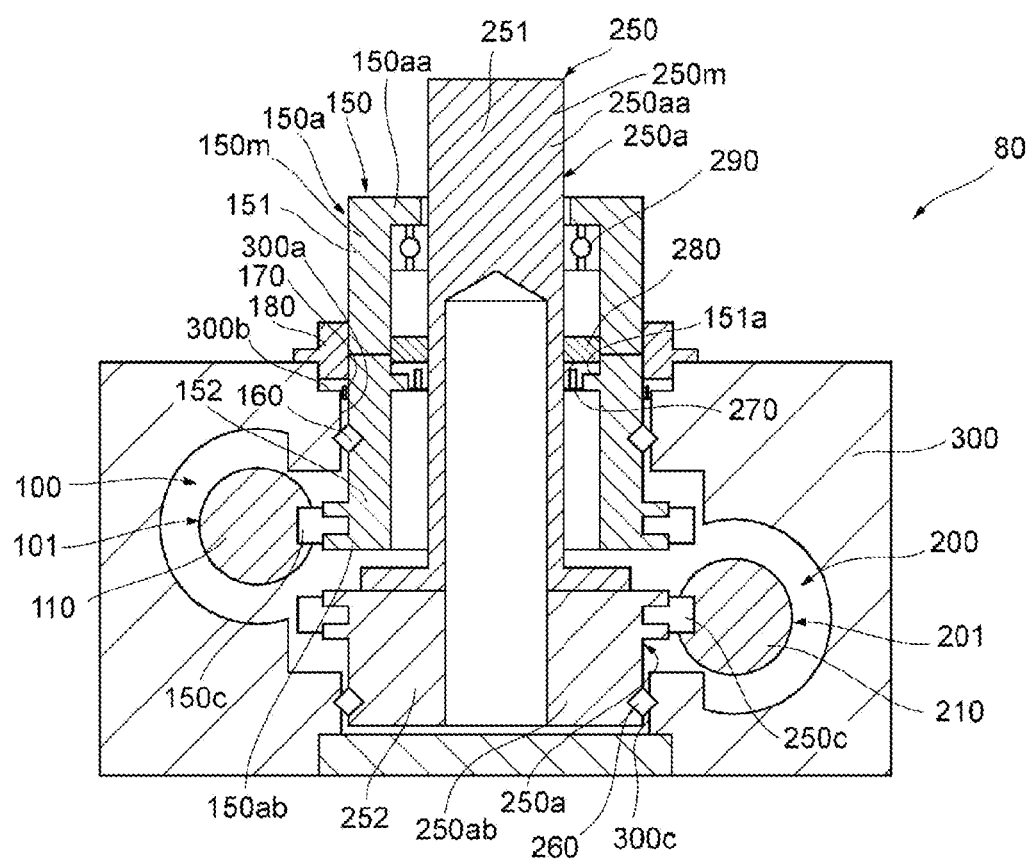
FIG. 11 is a sectional view taken along the line XI-XI of the drive device shown in FIG. 9.

More specifically, the central hub 45 is equipped with a coaxial dual shaft including a hollow external output shaft 150 (see FIG. 11) and an internal output shaft 250 passing through an inner hole of the external output shaft 150 (see FIG. 11). The external output shaft 150 is joined to the first arm 41, and the internal output shaft 250 is joined to the second arm 42.

The pick 46 includes a pick body 47 formed in a U-shape and a base plate 48 at which the pick body 47 is installed. The pick body 47 is installed at the base plate 48 by fastening means such as bolt screws, etc. The base plate 48 of the pick 46 supports one end of the first link 43 and one end of the second link 44, respectively. The other end of the first link 43 is supported by a leading end of the first arm 41. The other end of the second link 44 is supported by a leading end of the second arm 42. The frog-leg type transfer mechanism 12 is configured by the pick 46, the first and second links 43 and 44, and the first and second arms 41 and 42.

Figure 6:
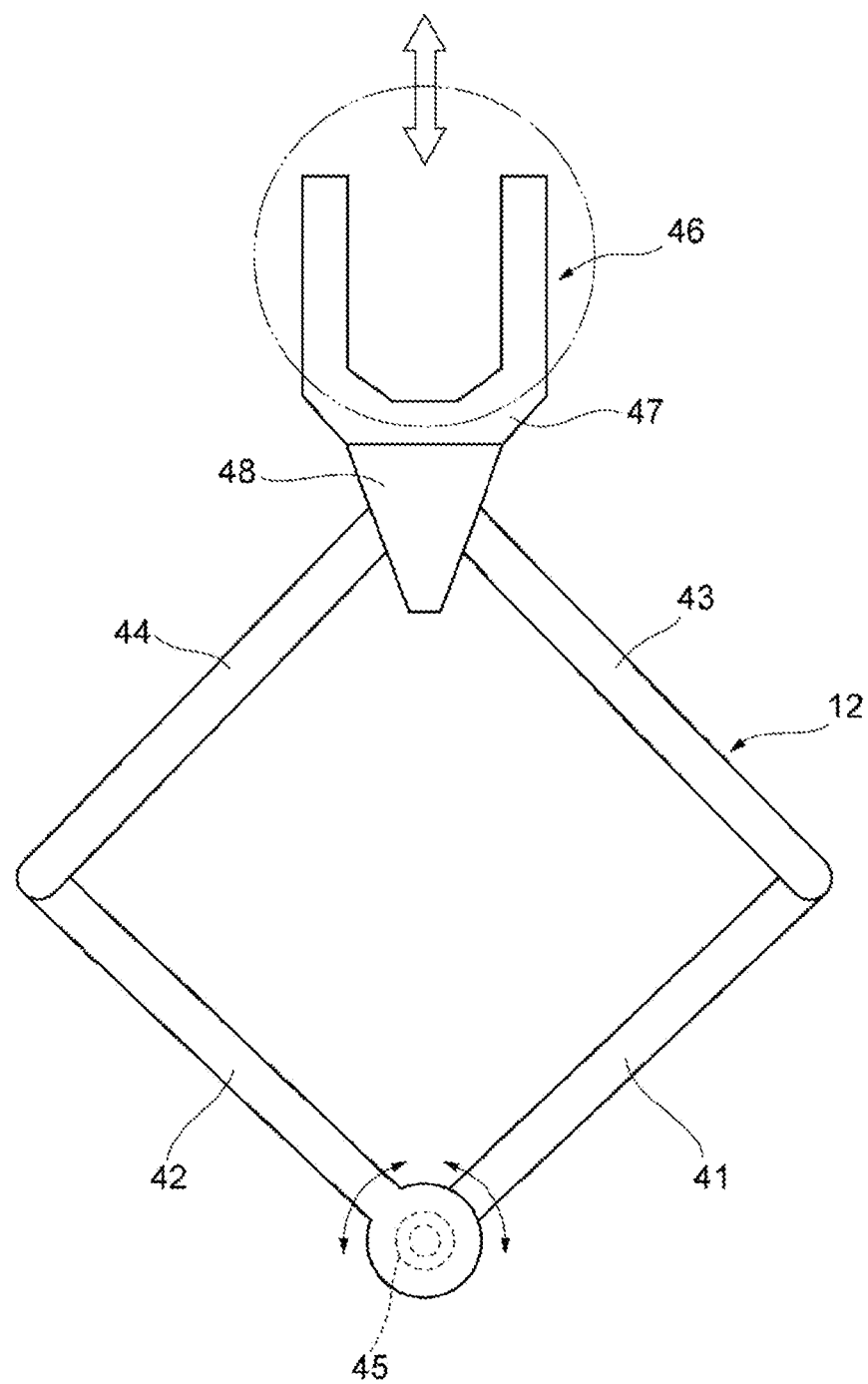
FIG. 6 is a perspective view showing the operation of the transfer mechanism according to one embodiment.
Figure 7:
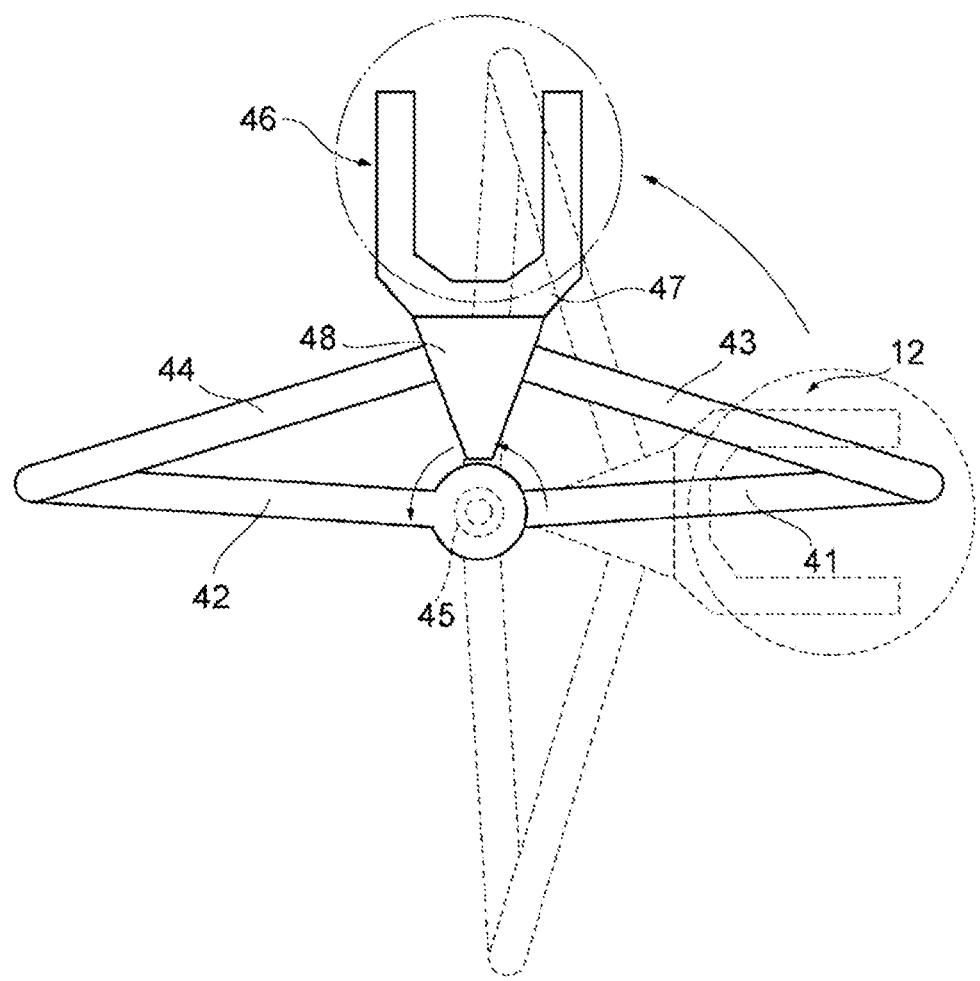
FIG. 7 is a perspective view showing the operation of the transfer mechanism according to one embodiment.

FIGS. 6 and 7 are views showing the operation of the transfer mechanism 12. As shown in FIG. 6, the motors 100 and 200 rotationally drive the arms 41 and 42 in a direction in which the arms 41 and 42 approach each other (a direction in which an angle defined by the arms 41 and 42 becomes smaller), thereby stretching the transfer mechanism 12. On the contrary, the motors 100 and 200 rotationally drive the arms 41 and 42 in a direction in which the arms 41 and 42 become spaced apart from each other (a direction in which the angle defined by the arms 41 and 42 becomes larger), thereby retracting the transfer mechanism 12. In addition, as shown in FIG. 7, the motors 100 and 200 rotationally drive the arms 41 and 42 in the same direction, thereby rotating the entire transfer mechanism 12.

The operation of the first vacuum transfer robot 56 is as follows. When the atmospheric transfer robot in the atmospheric transfer chamber 25 loads the substrate into the first load lock chamber 26-1 or 26-2, the gate valve 51 at the atmospheric transfer chamber 25 of the first load lock chamber 26-1 or 26-2 is closed, thereby depressurizing the first load lock chamber 26-1 or 26-2. When the first load lock chamber 26-1 or 26-2 is in a low pressure state, the gate valve 52 at the first transfer chamber 27 is opened, thereby connecting the first load lock chamber 26-1 or 26-2 and the first transfer chamber 27. The first vacuum transfer robot 56 receives the unprocessed substrate transferred to the first load lock chamber 26-1 or 26-2, inserts the substrate to the first transfer chamber 27, and then delivers the substrate to the first process chamber 23-1 or 23-2.

When the processing at the first process chamber 23-1 or 23-2 is completed, the first vacuum transfer robot 56 receives the processed substrate from the first process chamber 23-1 or 23-2, inserts the substrate to the first transfer chamber 27, and then delivers the substrate to the first process chambers 23-1 and 23-2 or the first load lock chambers 26-1 and 26-2 which perform the next processing. If the substrate is delivered to the first load lock chamber 26-1 or 26-2, the gate valve 52 at the first transfer chamber 27 is closed, and the gate valve 51 at the atmospheric transfer chamber 25 is opened. Accordingly, the first load lock chamber 26-1 or 26-2 returns to atmospheric pressure. The atmospheric transfer robot in the atmospheric transfer chamber 25 receives the processed substrate from the first load lock chamber 26-1 or 26-2 and returns the substrate to the cassette set to the port 21.

Figure 8:
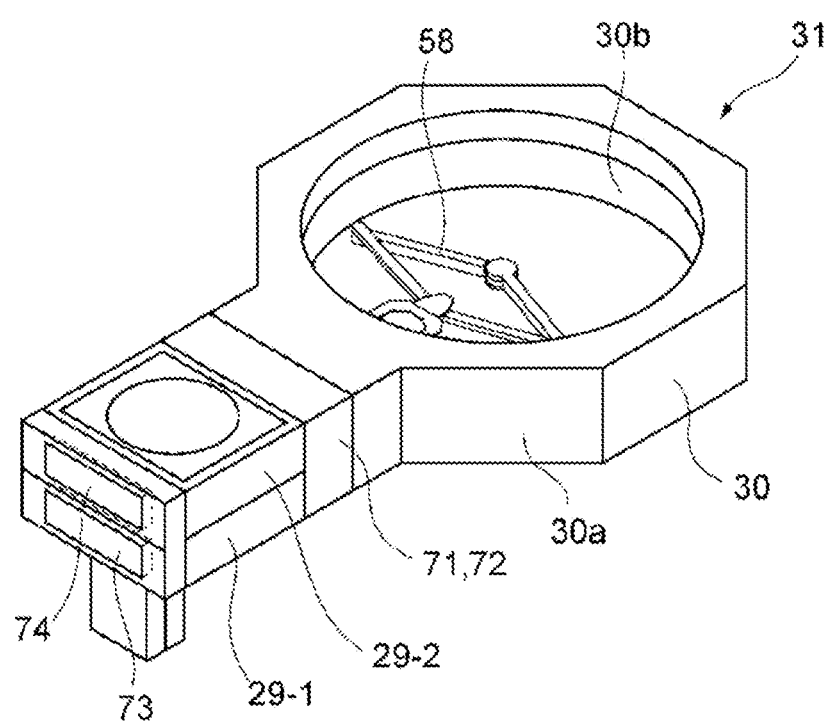
FIG. 8 is a perspective view showing a second load lock chamber and a second transfer chamber according to one embodiment.

FIG. 8 is a perspective view showing the second load lock chambers 29-1 and 29-2 and the second transfer chamber 30. The second transfer chamber 30 is connected to the two vertically placed second load lock chambers 29-1 and 29-2 through the two vertically placed gate valves 71 and 72. The second load lock chambers 29-1 and 29-2 each include a small room where depressurizing and the return to atmospheric pressure are performed repeatedly. The second load lock chambers 29-1 and 29-2 are connected to the atmospheric transfer chamber 25 through the gate valves 73 and 74, respectively. The second transfer chamber 30 includes a transfer space 30b formed by a chamber wall 30a. The transfer space 30b can be depressurized by an exhaust device.

In order to transfer the substrate to the two vertically placed second load lock chambers 29-1 and 29-2, the second vacuum transfer robot 58 includes a moving mechanism configured to elevate and lower the substrate in a vertical direction (the direction in which the two second load lock chambers 29-1 and 29-2 are arranged). The second load lock chambers 29-1 and 29-2 include a lifter configured to support the substrate and a lifter drive configured to elevate and lower the lifter. When the atmospheric transfer robot in the atmospheric transfer chamber 25 or the second vacuum transfer robot 58 loads the substrate into the second load lock chambers 29-1 and 29-2, the lifter is in a lowered position. If the loading of the substrate is completed, the lifter is elevated and then receives the substrate from the atmospheric transfer robot in the atmospheric transfer chamber 25 or the second vacuum transfer robot 58. On the contrary, when the atmospheric transfer robot in the atmospheric transfer chamber 25 or the second vacuum transfer robot 58 takes out the substrate from the second load lock chambers 29-1 and 29-2, the lifter is in an elevated position. In the step in which the atmospheric transfer robot in the atmospheric transfer chamber 25 or the second vacuum transfer robot 58 enters the second load lock chambers 29-1 and 29-2, the lifter is lowered, and the substrate is delivered from the lifter to the atmospheric transfer robot in the atmospheric transfer chamber 25 or the second vacuum transfer robot 58.

In the same way as the first vacuum transfer robot 56, the second vacuum transfer robot 58 also includes the transfer mechanism 12 having a pair of arms and the drive device 80 configured to drive the transfer mechanism 12, as described with reference to FIG. 5 and the like.

The operation of the second vacuum transfer robot 58 is as follows. When the atmospheric transfer robot in the atmospheric transfer chamber 25 loads the substrate into the second load lock chamber 29-1 or 29-2, the gate valve 73 at the atmospheric transfer chamber 25 of the second load lock chamber 29-1 or the gate valve 74 at the atmospheric transfer chamber 25 of the second load lock chamber 29-2 is closed, thereby depressurizing the second load lock chamber 29-1 or 29-2. When the second load lock chamber 29-1 or 29-2 is in a low pressure state, the gate valve 71 or 72 at the second transfer chamber 30 is opened, and the second load lock chamber 29-1 or 29-2 and the second transfer chamber 30 communicate with each other. The second vacuum transfer robot 58 receives the unprocessed substrate transferred to the second load lock chamber 29-1 or 29-2, inserts the substrate to the second transfer chamber 30, and then delivers the substrate to the second process chamber 24-1 or 24-2.

When the processing at the second process chamber 24-1 or 24-2 is completed, the second vacuum transfer robot 58 receives the processed substrate from the second process chamber 24-1 or 24-2, inserts the substrate to the second transfer chamber 30, and then delivers the substrate to the second process chambers 24-1 and 24-2 or the second load lock chambers 29-1 and 29-2 which perform the next processing. If the substrate is delivered to the second load lock chamber 29-1 or 29-2, the gate valve 71 or 72 at the second transfer chamber 30 is closed, and the gate valve 73 or 74 at the atmospheric transfer chamber 25 is opened. Accordingly, the second load lock chamber 29-1 or 29-2 returns to have an atmospheric pressure. The atmospheric transfer robot in the atmospheric transfer chamber 25 receives the processed substrate from the second load lock chamber 29-1 or 29-2 and returns the substrate to the cassette set to the port 21.

Figure 9:
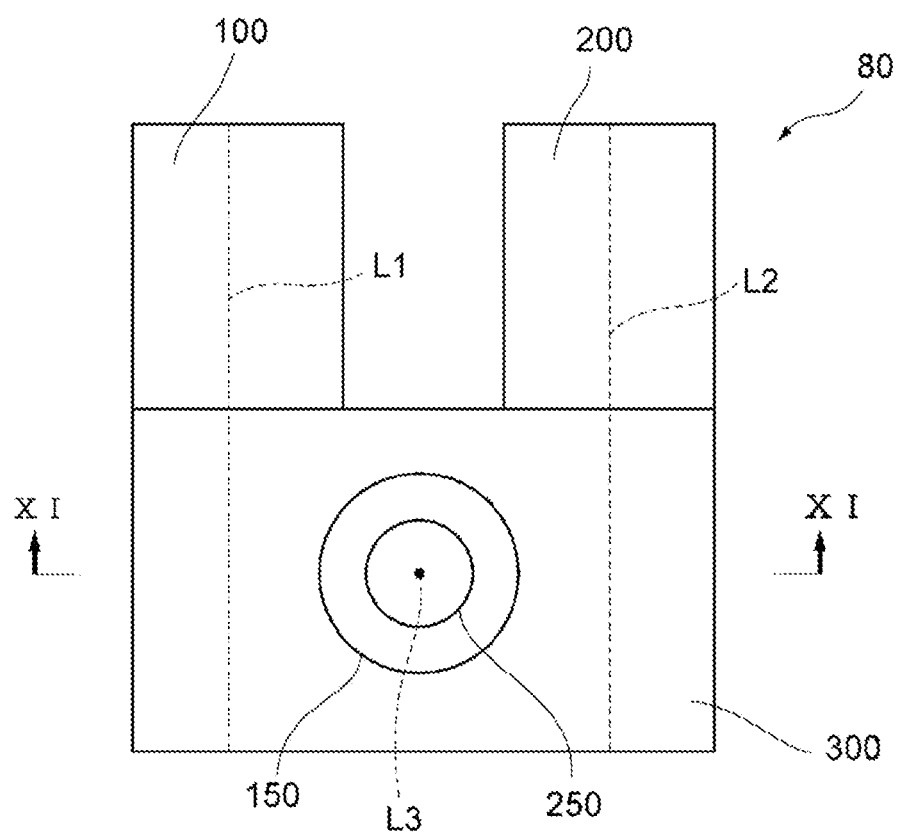
FIG. 9 is a view of the drive device according to one embodiment as viewed from a side at which an arm is installed.
Figure 10:
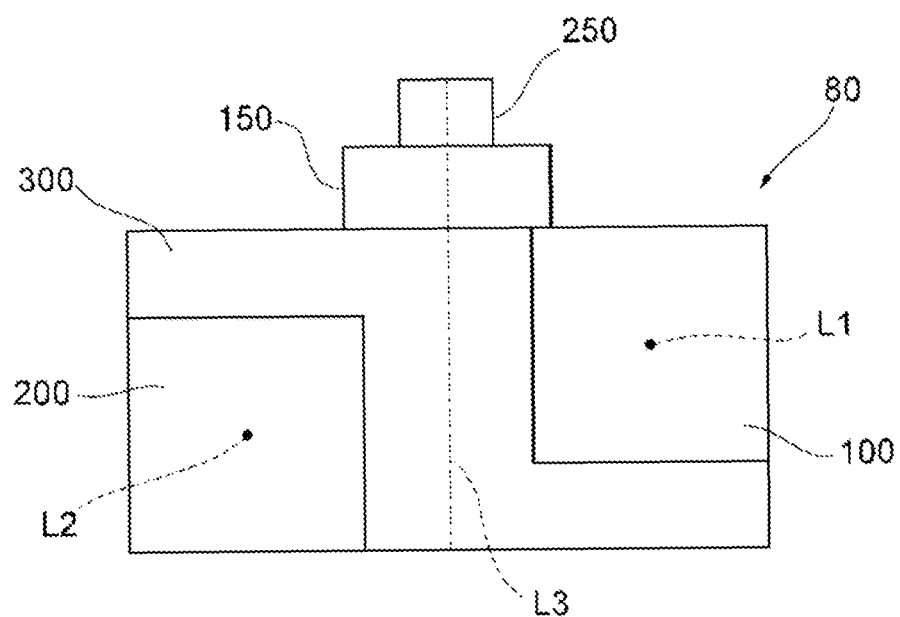
FIG. 10 is a view of the drive device according to one embodiment as viewed from a side at which a motor is installed.

Next, the drive device 80 provided in the first vacuum transfer robot 56 and the second vacuum transfer robot 58, will be described in detail. FIG. 9 is a view of the drive device 80 as viewed from a side at which the arms are installed. FIG. 10 is a view of the drive device 80 as viewed from a side at which the motor is installed. FIG. 11 is a sectional view along the line XI-XI shown in FIG. 9. The drive device 80 includes the first motor 100, the second motor 200, the external output shaft (the first output shaft) 150 and the internal output shaft (the second output shaft) 250 connected to the first and second arms 41 and 42, and a main body case 300 accommodating the external output shaft 150 and the internal output shaft 250.

The first motor 100 drives the external output shaft 150, and the second motor 200 drives the internal output shaft 250. The first motor 100 and the second motor 200 are fixed to the lateral side of the main body case 300. A leading end portion of an output shaft 101 of the first motor 100 and a leading end portion of an output shaft 201 of the second motor 200 are inserted to the main body case 300.

The first motor 100 and the second motor 200 are placed such that a first axial line L1 of the output shaft 101 of the first motor 100 and a second axial line L2 of the output shaft 201 of the second motor 200 are parallel to each other (see FIG. 9). The first axial line L1 of the output shaft 101 of the first motor 100 and the second axial line L2 of the output shaft 201 of the second motor 200 are perpendicular to the third axial line L3 of the external output shaft 150 and the internal output shaft 250. That is, the direction of the axial line of the rotation of the first motor 100 and the second motor 200 is changed within the main body case 300. In addition, as viewed from the direction of the axial line of the external output shaft 150 and the internal output shaft 250 (the direction of the third axial line L3), the third axial line L3 of the external output shaft 150 and the internal output shaft 250 is interposed between the first axial line L1 of the output shaft 101 of the first motor 100 and the second axial line L2 of the output shaft 201 of the second motor 200 (see FIGS. 9 and 10).

As shown in FIG. 10, in the direction of the third axial line L3 of the external output shaft 150 and the internal output shaft 250, the housings of the first motor 100 and the second motor 200 overlap each other.

As shown in FIG. 11, the external output shaft 150 has a cylindrical shape extending along the third axial line L3. In addition, the external output shaft 150 has an external shaft body (the first shaft body) 150a and roller followers 150c. The external shaft body 150a includes one end 150aa protruding to extend from the main body case 300 to the outside and the other end 150ab accommodated in the main body case 300. The roller followers 150c are installed on the outer peripheral surface of the other end 150ab of the external shaft body 150a and is engaged with a rib 110 installed at the output shaft 101 of the first motor 100. The plurality of roller followers 150c is placed on the outer peripheral surface of the external shaft body 150a at equidistant intervals.

Figure 12:
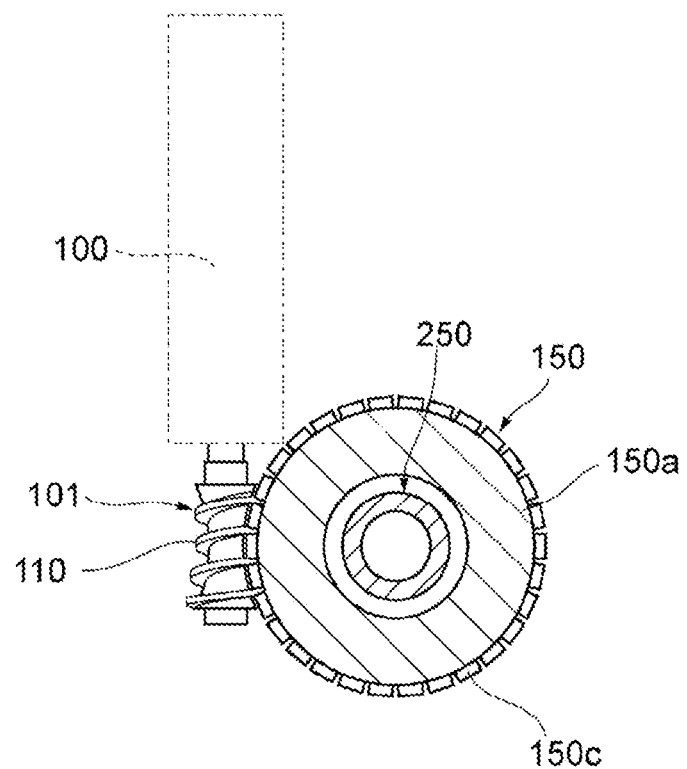
FIG. 12 is a view showing the engagement of a rib of a first motor and roller followers of an external shaft driving transmission part according to one embodiment.

FIG. 12 is a view showing the engagement of the rib 110 and the roller followers 150c. As shown in FIG. 12, the rib 110 is provided in a spiral shape at the outer peripheral surface of the output shaft 101 of the first motor 100. The roller followers 150c are engaged at a predetermined reduction gear ratio with the rib 110. When the output shaft 101 rotates, the rib 110 causes the roller followers 150c to progress in the direction of the axial line of the output shaft 101, thereby rotating the external output shaft 150. The rotational frequency of the output shaft 101 of the first motor 100 is reduced and transmitted to the external output shaft 150. In addition, the rotational force of the external output shaft 150 becomes greater than that of the output shaft 101 of the first motor 100.

As shown in FIG. 11, a vacuum seal (first sealing member) 170 is placed between an inner peripheral case surface 300a of the main body case 300 and the outer peripheral surface of the external shaft body 150a. The interior and the exterior of the main body case 300 are separated by the vacuum seal 170 in which is located between the inner peripheral case surface 300a of the main body case 300 and the outer peripheral surface of the external shaft body 150a. A magnetic fluid seal, for example, may be used for the vacuum seal 170.

A seal push surface 300b facing an outer space of the main body case 300 is formed on the inner peripheral case surface 300a by forming a step-shaped cross section of the inner peripheral case surface 300a parallel to the direction of the axial line of the external output shaft 150. In one embodiment, the vacuum seal 170 may be fixed to the main body case 300 by interposing an outer peripheral portion of the vacuum seal 170 between the seal push surface 300b and a push member 180. The inner peripheral surface of the vacuum seal 170 is in slideable contact with the outer peripheral surface of the external shaft body 150a.

In one embodiment, an external shaft bearing 160 configured to support the external output shaft 150 may be installed between the inner peripheral case surface 300a of the main body case 300 and the outer peripheral surface of the external shaft body 150a and also between the vacuum seal 170 and the other end 150ab of the external shaft body 150a.

Further, in one embodiment, the external shaft bearing 160 may be configured to extend along a closed curve having a diameter smaller than the outer diameter of the roller followers 150c of the external output shaft 150. That is, the external shaft bearing 160 may support the external output shaft 150 at the side of an axial center of the external output shaft 150 rather than at a position of transmitting a driving force from the rib 110 of the first motor 100 to the roller followers 150c.

Further, in one embodiment, the external shaft body 150a may be configured by a first portion 151 including the one end 150aa of the external shaft body 150a and a second portion 152 including the other end 150ab of the external shaft body 150a. In addition, the second portion 152 may be formed as a separate body from the first portion 151 and also formed of a material different from that of the first portion 151.

An installation unit 150m of the first arm 41 is provided at a portion of the first portion 151 of the outside shaft body 150a, which is exposed from the main body case 300. The roller followers 150c are installed at the second portion 152. The first portion 151 and the second portion 152 are connected to each other by bolts or the like.

As shown in FIG. 11, the internal output shaft 250 is installed coaxially with the external output shaft 150, such that the internal output shaft 250 passes through the inner hole of the external shaft body 150a. In addition, the internal output shaft 250 has an internal shaft body (the second shaft body) 250a and roller followers 250c. The internal shaft body 250a includes one end 250aa protruding to extend outside of the main body case 300 and the other end 250ab protruding to extend from the inner hole of the external shaft body 150a into the main body case 300. The roller followers 250c are installed on the outer peripheral surface of the other end 250ab of the internal shaft body 250a and is engaged at a predetermined reduction gear ratio with a rib 210 installed at the output shaft 201 of the second motor 200. The multiple roller followers 250c are placed on the outer peripheral surface of the internal shaft body 250a at equidistant intervals.

The rib 210 is formed in a spiral shape on the outer peripheral surface of the output shaft 201 of the second motor 200. In the same way as the configuration by which the rib 110 of the first motor 100 rotates the external output shaft 150, the rotation of the output shaft 201 of the second motor 200 rotates the internal output shaft 250. The rotational frequency of the output shaft 201 of the second motor 200 is reduced and transmitted to the internal output shaft 250. In addition, the rotational force of the internal output shaft 250 becomes greater than that of the output shaft 201 of the second motor 200.

A vacuum seal (second sealing member) 270 is placed between the external output shaft 150 and the internal output shaft 250. The vacuum seal 270 separates the interior and the exterior of the main body case 300 inform each other and is located between the inner peripheral surface of the external output shaft 150 and the outer peripheral surface of the internal output shaft 250, thereby maintaining a high-degree vacuum state. A magnetic fluid seal, for example, may be used for the vacuum seal 270.

A seal push surface 151a facing an outer space of the main body case 300 is formed on the inner peripheral surface of the second portion 152 and protrudes toward the side of an axial center of the second portion 152. In one embodiment, the vacuum seal 270 may be fixed to the internal output shaft 250 by interposing an outer peripheral portion of the vacuum seal 270 between the seal push surface 151a and a push member 280. The inner peripheral surface of the vacuum seal 270 is in slideable contact with the outer peripheral surface of the internal shaft body 250a.

In one embodiment, an internal shaft bearing 260 may be installed between the outer peripheral surface of the other end 250ab of the internal shaft body 250a and an inner peripheral case surface 300c of the main body case 300.

Further, in one embodiment, the internal shaft bearing 260 may be configured to extend along a closed curve having a diameter smaller than the outer diameter of the roller followers 250c of the internal output shaft 250. That is, the internal shaft bearing 260 supports the internal output shaft 250 at the side of an axial center of the internal output shaft 250 rather than at a position of transmitting a driving force from the rib 210 of the second motor 200 to the roller followers 250c.

In the end of the external output shaft 150 exposed from the main body case 300, a bearing 290 is installed between the external shaft body 150a and the internal shaft body 250a.

Further, in one embodiment, the internal shaft body 250*a* may be configured by a first portion 251 including the one end 250*aa* of the internal shaft body 250*a* and a second portion 252 including the other end 250*ab* of the internal shaft body 250*a*. In addition, the second portion 252 may be formed as a separate body from the first portion 251 and also formed of a material different from that of the first portion 251.

An installation unit 250*m* of the second arm 42 is provided at a portion of the first portion 251 of the internal shaft body 250*a*, which is exposed from the main body case 300. The roller followers 250*c* are installed at the second portion 252. The first portion 251 and the second portion 252 are connected to each other by bolts or the like.

Further, in one embodiment, the roller followers 150*c* may be formed to have the same outer diameter as the roller followers 250*c*. That is, the length from the position, where the driving force is transmitted from the rib 110 of the first motor 100 to the external shaft body 150*a*, to the axial center of the external output shaft 150 may be identical to the length from the position, where the driving force is transmitted from the rib 210 of the second motor 200 to the internal shaft body 250*a*, to the axial center of the internal output shaft 250.

Figure 13:
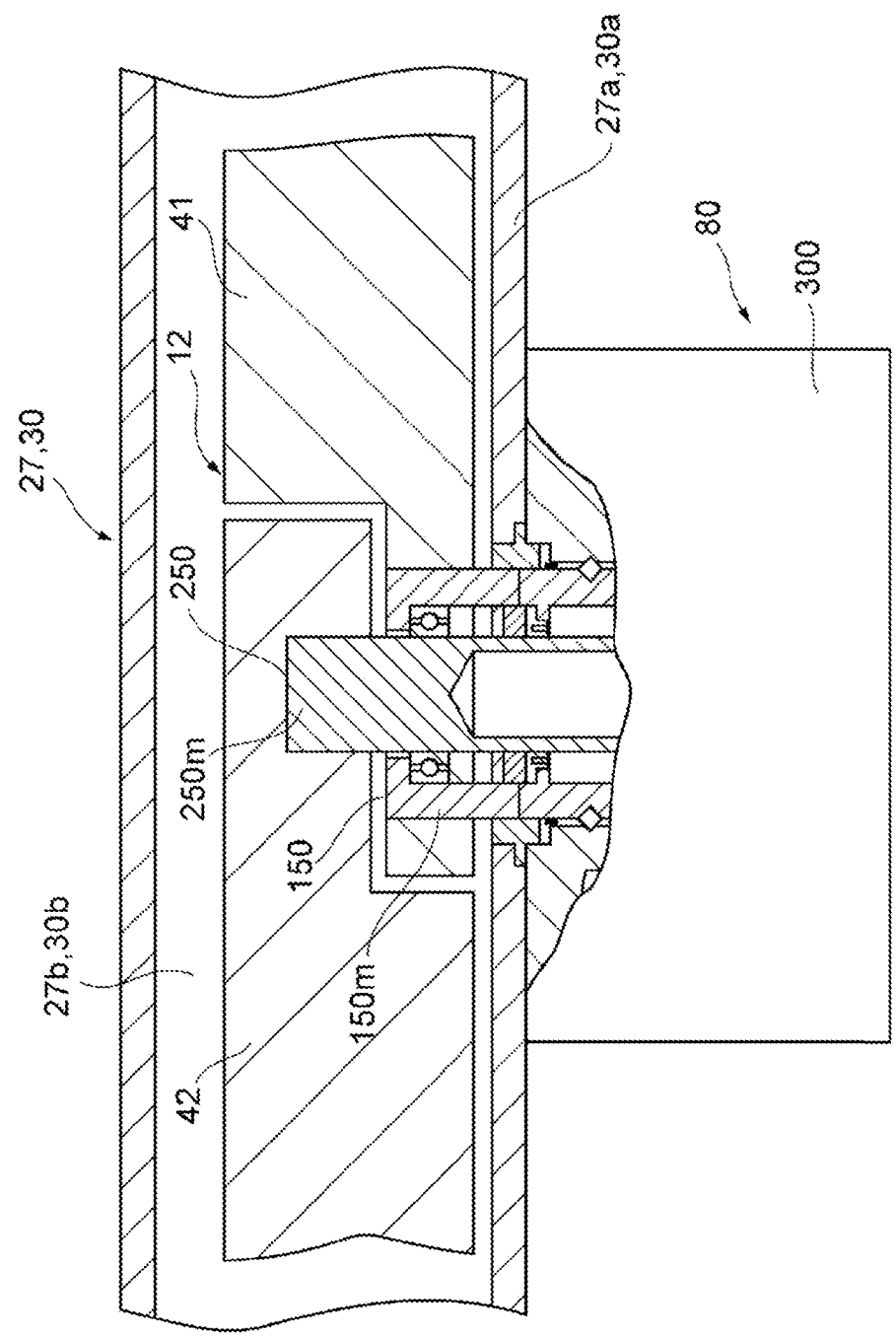
FIG. 13 is a sectional view showing an installed structure of the transfer mechanism and the drive device according to one embodiment.

FIG. 13 is a schematic sectional view showing an installation structure of the transfer mechanism 12. As shown in FIG. 13, the internal output shaft 250 protrudes outwardly more than the external output shaft 150 of the main body case 300. The leading end portions of the external output shaft 150 and the internal output shaft 250 protruding from the main body case 300 are inserted from the outer surface of the chamber walls 27*a* and 30*a* of the first and second transfer chambers 27 and 30. In the first and second transfer chambers 27 and 30, the arms 41 and 42 are installed at the installation unit 150*m* of the external output shaft 150 and the installation unit 250*m* of the internal output shaft 250, respectively.

The main body case 300 of the drive device 80 is installed on the outer surface of the chamber walls 27*a* and 30*a* of the first and second transfer chambers 27 and 30, such that the airtightness in the transfer spaces 27*b* and 30*b* is secured. The gaps between the main body case 300 and the internal output shaft 250 and between the external output shaft 150 and the internal output shaft 250 are sealed by the vacuum seals 170 and 270, respectively. With this configuration, it is possible to maintain a low pressure state in the transfer spaces 27*b* and 30*b* of the first and second transfer chambers 27 and 30. As described above, the drive device 80 may be used even when it is needed to maintain a state of high-degree vacuum at a low pressure in the first and second transfer chambers 27 and 30.

Hereinafter, one example of the above-described drive device 80 will be described. In the above-described substrate processing system 10, when a wafer was transferred, the following processes were performed:

(Process 1): stretching the transfer mechanism 12 installed at the drive device 80, (Process 2): lowering the lifter mounted with the wafer and loading the wafer onto the pick 46 of the transfer mechanism 12, (Process 3): retracting the transfer mechanism 12 mounted with the wafer, (Process 4): rotating the entire the transfer mechanism 12 mounted with the wafer to a predetermined position, (Process 5): stretching the transfer mechanism 12 again, (Process 6): raising the lifter and mounting the wafer on the lifter, and (Process 7): retracting the transfer mechanism 12.

In the example, the necessary time for each process was as described below. In addition, as a comparative example, when a direct drive motor (for example, a driving method described in Japanese Patent Laid-Open Publication No. (Hei) 3-136779) was used to drive the arms 41 and 42, the time needed for each process was measured. Each process in the comparative example is the same as the corresponding process of the example.

(Measurement Result of Example Using Drive device 80)
Process 1 (Stretching Arm): 0.3 second
Process 2 (Elevating Lifter): 0.8 second
Process 3 (Retracting Arm): 1.3 seconds (Operating Limit)
Process 4 (Rotating Arm): 1.2 seconds (Operating Limit)
Process 5 (Stretching Arm): 1.3 seconds (Operating Limit)
Process 6 (Lowering Lifter): 0.8 second
Process 7 (Retracting Arm): 0.3 second As described above, in the example, the total time for performing Processes 1 to 7 was 6.0 seconds. In addition, the operations of Processes 3 to 5 are operating limits of the method of holding the wafer on the pick 46 of the transfer mechanism 12 and are not given by the performance of the drive device 80.

Comparative Example Using Direct Drive Motor

Process 1 (Stretching Arm): 1.0 second
Process 2 (Elevating Lifter): 0.8 second
Process 3 (Retracting Arm): 1.3 seconds (Operating Limit)
Process 4 (Rotating Arm): 1.2 seconds (Operating Limit)
Process 5 (Stretching Arm): 1.3 seconds (Operating Limit)
Process 6 (Lowering Lifter): 0.8 second
Process 7 (Retracting Arm): 1.0 second As described above, in the comparative example, the total time for performing Processes 1 to 7 was 7.4 seconds. In addition, the operations of Processes 3 to 5 are operating limits of the method of holding the wafer on the pick 46 of the transfer mechanism 12.

As described above, in the example using the drive device 80, the operating speed of Processes 1 and 7 was especially improved, thereby reducing the time needed to transfer the wafer, as compared to the comparative example using the direct drive motor.

The embodiment is configured as described above. The drive device 80 having the two coaxial rotary shafts (the external output shaft 150 and the internal output shaft 250) includes the vacuum seal 170 placed between the main body case 300 and the external output shaft 150 and the vacuum seal 270 placed between the external output shaft 150 and the internal output shaft 250, thereby separating the space inside the main body case 300 of the drive device 80 from the space outside the main body case 300 in a high-degree vacuum state. Accordingly, even when the drive device 80 is used in a high-degree vacuum state in a low pressure environment, the space inside the main body case 300 of the drive device 80 (the side at an atmospheric pressure environment) and the space of a low pressure environment are separated in a high-degree vacuum state, enabling the drive device 80 to be used in a high-degree vacuum state in a low pressure environment.

In addition, the vacuum seal 170 placed between the external output shaft 150 and the main body case 300 is in contact with the external shaft body 150*a*, which rotates at a rotational frequency lower than that of the output shaft 101 of the first motor 100. The vacuum seal 270 placed between the external output shaft 150 and the internal output shaft 250 is in contact with the external shaft body 150a, which rotates at a rotational frequency lower than that of the output shaft 101 of the first motor 100, and the internal shaft body 250a, which rotates at a rotational frequency lower than that of the output shaft 201 of the second motor 200. In this case, as compared to the case in which the vacuum seals 170 and 270 are in contact with the output shaft 101 of the first motor 100 or the output shaft 201 of the second motor 200, the sealability and maintenability of the vacuum seals 170 and 270 can be improved.

In addition, as viewed in the direction of the axial line of the external output shaft 150, the first motor 100 and the second motor 200 are positioned, such that the third axial line L3 of the external output shaft 150 and the internal output shaft 250 is interposed between the first axial line L1 of the output shaft 101 of the first motor 100 and the second axial line L2 of the output shaft 201 of the second motor 200. With this configuration, the first motor 100 and the second motor 200 may be placed to overlap each other in the direction of the axial line of the external output shaft 150 (the direction of the third axial line L3) (see FIG. 10). That is, in order to prevent the interference between the first motor 100 and the second motor 200 in the direction of the axial line of the external output shaft 150, the external output shaft 150 or the internal output shaft 250 do not need to be elongated. As described above, the external output shaft 150 and the internal output shaft 250 can be shortened, thereby enabling miniaturization of the drive device 80. In addition, since the external output shaft 150 and the internal output shaft 250 can be shortened, it is possible to improve the stiffness of the external output shaft 150 and the internal output shaft 250.

FIG. 14 is a view of the surrounding of the second transfer chamber 30 as viewed from the back side of the substrate processing system 10. As described above, the drive device 80 can be miniaturized. With this configuration, as shown in FIG. 14, the length of the drive device 80 that protrudes from the chamber wall 30a of the second transfer chamber 30 can be shortened. Accordingly, the substrate processing system 10 may secure a wide space under the second transfer chamber 30. In the same way, the length of the drive device 80 that protrudes from the chamber wall 27a can also be shortened for the drive device 80 installed at the chamber wall 27a of the first transfer chamber 27. Thus, the substrate processing system 10 may secure a wide space under the first transfer chamber 27. As described above, since a wide working space can be secured under the first and second transfer chambers 27 and 30, it is possible to improve the maintenability of the substrate processing system 10.

In one embodiment, since the vacuum seal 270 placed between the external output shaft 150 and the internal output shaft 250 is fixed to the external output shaft 150, a slideable contact portion of the vacuum seal 270 is the only portion in which the vacuum seal 270 is in contact with the internal output shaft 250. As described above, the slideable contact portion of the vacuum seal 270 can be made only in the portion which is in contact with the internal output shaft 250, thereby improving the sealability or maintenability of the vacuum seal 270.

In one embodiment, by configuring the internal output shaft 250 with the two members of the first portion 251 and the second portion 252, the first portion 251 and the second portion 252 may be formed of different materials, respectively. Accordingly, the internal output shaft 250 can be formed according to the strength of the external output shaft 150, and thus, the strength of the internal output shaft 250 and that of the external output shaft 150 may be set to be approximately equal. For example, SiC with a high degree of stiffness is used as a material for the first portion 251 of the internal output shaft 250, thereby making the strength of the external output shaft 150 and the internal output shaft 250 approximately equal.

Further, in one embodiment, by forming the external output shaft 150 with the two members of the first portion 151 and the second portion 152, the first portion 151 and the second portion 152 may be formed of different materials, respectively. Accordingly, the external output shaft 150 can be formed according to the strength of the internal output shaft 250, and thus, the strength of the external output shaft 150 and that of the internal output shaft 250 may be set to be approximately equal.

In addition, the control of a rotational angle of the arms 41 and 42, i.e., the control of the first motor 100 and the second motor 200, can be made easier by making a rotational angle of the external output shaft 150 with respect to the rotation of the first motor 100 and a rotational angle of the internal output shaft 250 with respect to the rotation of the second motor 200 equal. Thus, in one embodiment, by forming the outer diameter of the roller followers 150c of the external output shaft 150 to be identical to that of the roller followers 250c of the internal output shaft 250, a rotational angle of the external output shaft 150 with respect to the rotation of the first motor 100 and a rotational angle of the internal output shaft 250 with respect to the rotation of the second motor 200 can be identical. Accordingly, the rotational angle of the arms 41 and 42 is controlled more easily.

Further, the vibration of the external output shaft 150 becomes less in the vicinity of the portion of the external output shaft 150 which is supported by the external shaft bearing 160. Thus, in one embodiment, the external shaft bearing 160 and the vacuum seal 170 may be placed close to each other by interposing the external shaft bearing 160 between the vacuum seal 170 and the other end 150ab of the external shaft body 150a. With this configuration, the vacuum seal 170 is in contact with the portion of the external output shaft 150 with less vibration, thereby improving the sealability of the vacuum seal 170.

Further, in one embodiment, the external shaft bearing 160 may extend along a closed curve having a diameter smaller than the outer diameter of the roller followers 150c of the external output shaft 150. In this case, the external shaft bearing 160 supports the external output shaft 150 at the side of the axial center of the external output shaft 150 rather than at the outer diameter of the roller followers 150c. Accordingly, it is possible to increase the stiffness of the external output shaft 150 due to the external shaft bearing 160.

Also, in one embodiment, the internal shaft bearing 260 may extend along a closed curve having a diameter smaller than the outer diameter of the roller followers 250c of the internal output shaft 250. In this case, the internal shaft bearing 260 supports the internal output shaft 250 at the side of the axial center of the internal output shaft 250 rather than at the outer diameter of the roller followers 250c. Accordingly, it is possible to increase the stiffness of the internal output shaft 250 due to the internal shaft bearing 260.

In addition, the embodiment is not limited to the above-described configuration. For example, the vacuum seal 270 placed between the external output shaft 150 and the internal output shaft 250 may be fixed not to the external output shaft 150, but to the internal output shaft 250. In this case, a slideable contact portion of the vacuum seal 270 is the only portion which is in contact with the external output shaft 150. As described above, the slideable contact portion of the vacuum seal 270 can be made to be the only portion which is in contact with the external output shaft 150, thereby improving the sealability or maintenability of the vacuum seal 270. In the same way, the vacuum seal 170 may also be fixed not to the main body case 300, but to the external output shaft 150.

Further, only one of the external output shaft 150 and the internal output shaft 250 may be configured by the two members.

The drive device 80 may also be used in devices other than the transfer module of the substrate processing system.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A drive device, comprising:
a case;
a first motor having an output shaft extending along a first axial line in the case, the output shaft including an outer peripheral surface having a rib formed in a spiral shape;
a second motor having an output shaft extending along a second axial line parallel to the first axial line in the case, the output shaft including an outer peripheral surface having a rib formed in a spiral shape;
a first output shaft including a first shaft body and roller followers, the first shaft body having a cylindrical shape extending along a third axial line extending in a direction perpendicular to the first axial line and the second axial line between the first axial line and the second axial line, the first shaft body having one end protruding to extend outside the case and the other end accommodated in the case, the roller followers being installed on an outer peripheral surface of the other end and engaged at a predetermined reduction gear ratio with the rib of the first motor;
a second output shaft including a second shaft body and roller followers, the second shaft body being installed coaxially with the first shaft body to pass through an inner hole of the first shaft body, the second shaft body having one end protruding to extend outside the case and the other end protruding to extend from the inner hole of the first shaft body into the case, the roller followers being installed on the other end of the second shaft body and engaged at a predetermined reduction gear ratio with the rib of the second motor;
a first sealing member located between the case and the outer peripheral surface of the first shaft body;
a second sealing member located between an inner peripheral surface of the first shaft body and an outer peripheral surface of the second shaft body; and
a bearing configured to support the first output shaft, the bearing being installed between the outer peripheral surface of the first shaft body and the case and also between the first sealing member and the other end of the first shaft body,
wherein the diameter of the roller followers of the first output shaft is identical to that of the roller followers of the second output shaft,
wherein the first motor and the second motor are positioned such that the third axial line is interposed between the first motor and the second motor,
wherein the second shaft body includes a first portion having the one end of the second shaft body and a second portion having the other end of the second shaft body, the second portion being a separate body from the first portion and being made of a material different from that of the first portion such that a strength of the first and the second output shafts is approximately equalized, and
wherein the bearing extends along a closed curve having a diameter smaller than an outer diameter of the roller followers of the first output shaft.

2. The drive device of claim 1, wherein the second sealing member is installed at the first shaft body or the second shaft body.

3. The drive device of claim 1, further comprising an additional bearing configured to support the second output shaft, the additional bearing extending along a closed curve having a diameter smaller than an outer diameter of the roller followers of the second output shaft between the outer peripheral surface of the other end of the second shaft body and the case.

4. A substrate processing system, comprising:
a loader module configured to transfer a substrate in an atmospheric pressure environment;
a process module configured to process the substrate in a low pressure environment; and
a transfer module configured to transfer the substrate and installed between the loader module and the process module,
wherein the transfer module comprises
a chamber wall configured to form a depressurizable transfer space;
a transfer arm including a pair of arms installed within the transfer space; and
the drive device according to claim 1 installed on an outer surface of the chamber wall configured to secure airtightness of the transfer space,
wherein one of the pair of arms is connected to the one end of the first shaft body, and the other end of the pair of arms is connected to the one end of the second shaft body.

5. A drive device, comprising:
a case;
a first motor having an output shaft extending along a first axial line in the case, the output shaft including an outer peripheral surface having a rib formed in a spiral shape;
a second motor having an output shaft extending along a second axial line parallel to the first axial line in the case, the output shaft including an outer peripheral surface having a rib formed in a spiral shape;
a first output shaft including a first shaft body and roller followers, the first shaft body having a cylindrical shape extending along a third axial line extending in a direction perpendicular to the first axial line and the second axial line between the first axial line and the second axial line, the first shaft body having one end protruding to extend outside the case and the other end accommodated in the case, the roller followers being installed on an outer peripheral surface of the other end and engaged at a predetermined reduction gear ratio with the rib of the first motor;

a second output shaft including a second shaft body and roller followers, the second shaft body being installed coaxially with the first shaft body to pass through an inner hole of the first shaft body, the second shaft body having one end protruding to extend outside the case and the other end protruding to extend from the inner hole of the first shaft body into the case, the roller followers being installed on the other end of the second shaft body and engaged at a predetermined reduction gear ratio with the rib of the second motor;

a first sealing member located between the case and the outer peripheral surface of the first shaft body;

a second sealing member located between an inner peripheral surface of the first shaft body and an outer peripheral surface of the second shaft body; and a bearing configured to support the first output shaft, the bearing being installed between the outer peripheral surface of the first shaft body and the case and also between the first sealing member and the other end of the first shaft body, wherein the diameter of the roller followers of the first output shaft is identical to that of the roller followers of the second output shaft, wherein the first motor and the second motor are positioned such that the third axial line is interposed between the first motor and the second motor, wherein the first shaft body includes a first portion having the one end of the first shaft body and a second portion having the other end of the first shaft body, the second portion being a separate body from the first portion and being made of a material different from that of the first portion such that a strength of the first and the second output shafts is approximately equalized, and wherein the bearing extends along a closed curve having a diameter smaller than an outer diameter of the roller followers of the first output shaft.

6. The drive device of claim 5, wherein the second sealing member is installed at the first shaft body or the second shaft body.

7. The drive device of claim 5, further comprising an additional bearing configured to support the second output shaft, the additional bearing extending along a closed curve having a diameter smaller than an outer diameter of the roller followers of the second output shaft between the outer peripheral surface of the other end of the second shaft body and the case.

8. A substrate processing system, comprising:

a loader module configured to transfer a substrate in an atmospheric pressure environment;

a process module configured to process the substrate in a low pressure environment; and a transfer module configured to transfer the substrate and installed between the loader module and the process module, wherein the transfer module comprises a chamber wall configured to form a depressurizable transfer space;

a transfer arm including a pair of arms installed within the transfer space; and the drive device according to claim 4 installed on an outer surface of the chamber wall configured to secure airtightness of the transfer space, wherein one of the pair of arms is connected to the one end of the first shaft body, and the other end of the pair of arms is connected to the one end of the second shaft body.

* * * * *